(12) United States Patent
Hoshino

(10) Patent No.: US 9,804,507 B2
(45) Date of Patent: Oct. 31, 2017

(54) STAGE APPARATUS, LITHOGRAPHY APPARATUS, AND ARTICLE MANUFACTURING METHOD

(71) Applicant: CANON KABUSHIKI KAISHA, Tokyo (JP)

(72) Inventor: Hayato Hoshino, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 120 days.

(21) Appl. No.: 14/515,172

(22) Filed: Oct. 15, 2014

(65) Prior Publication Data

US 2015/0103329 A1    Apr. 16, 2015

(30) Foreign Application Priority Data

Oct. 16, 2013  (JP) ................................. 2013-215359
Oct. 9, 2014   (JP) ................................. 2014-208234

(51) Int. Cl.
  *G03B 27/58*  (2006.01)
  *G03B 27/62*  (2006.01)
  *G03F 7/20*   (2006.01)

(52) U.S. Cl.
  CPC ...... *G03F 7/70725* (2013.01); *G03F 7/70716* (2013.01); *G03F 7/70758* (2013.01); *G03F 7/70775* (2013.01)

(58) Field of Classification Search
  CPC ............ G03F 7/70716; G03F 7/70725; G03F 7/70758; G03F 7/70775; H02K 41/03; H02K 41/02; H02K 41/035–41/0356; H02K 41/031; H02K 3/16; H02K 3/32
  USPC ............. 355/52, 53, 55, 72–77; 250/442.11, 250/492.1, 492.2, 492.22, 493.1, 548; 310/12.01, 12.05, 12.06, 12.15, 310/12.21–12.22
  See application file for complete search history.

(56) References Cited

U.S. PATENT DOCUMENTS

| | | | | |
|---|---|---|---|---|
| 2,568,588 A | * | 9/1951 | MacGeorge | ............ B21B 38/00 318/657 |
| 3,912,991 A | * | 10/1975 | Moyse | ................. H02K 41/025 104/292 |
| 6,107,703 A | * | 8/2000 | Korenaga | ........... G03F 7/70691 310/12.06 |

(Continued)

FOREIGN PATENT DOCUMENTS

JP    2001-085503 A    3/2001

*Primary Examiner* — Christina Riddle
(74) *Attorney, Agent, or Firm* — Rossi, Kimms & McDowell LLP

(57) ABSTRACT

Provided is a stage apparatus that includes a first movable unit; a linear motor that includes a stator coil array arranged over a stroke range in a predetermined direction of the first movable unit and a mover magnet fixed to the first movable unit; a second movable unit that is arranged to face the first movable unit via a space and relatively moves with respect to the first movable unit in the predetermined direction; and a switch unit that forms a closed circuit including coils in the stator coil array and a resistance during operation of a dynamic brake, wherein the resistance value of a first coil located at a center region of the stroke range in the stator coil array is larger than that of a second coil located toward an end side of the stroke range rather than the center region in the stator coil array.

21 Claims, 6 Drawing Sheets

(56) References Cited

U.S. PATENT DOCUMENTS

| | | | |
|---|---|---|---|
| 7,880,864 B2* | 2/2011 | Shibata | G03B 27/32 |
| | | | 355/72 |
| 2006/0170888 A1* | 8/2006 | Asano | G03F 7/70725 |
| | | | 355/53 |
| 2007/0194632 A1* | 8/2007 | Yura | H02K 41/03 |
| | | | 310/12.22 |
| 2008/0170213 A1* | 7/2008 | Ohishi | G03B 27/32 |
| | | | 355/53 |

* cited by examiner

STAGE APPARATUS, LITHOGRAPHY APPARATUS, AND ARTICLE MANUFACTURING METHOD

BACKGROUND OF THE INVENTION

Field of the Invention

The present invention relates to a stage apparatus, a lithography apparatus, and an article manufacturing method.

Description of the Related Art

A lithography apparatus transfers a desired pattern onto, for example, a substrate in a lithography step included in manufacturing steps for manufacturing articles such as semiconductor devices, liquid crystal display devices, and the like. An exposure apparatus which is an example of the lithography apparatus transfers (exposes) a pattern which has been formed in advance on an original (a reticle, a mask, or the like) onto a substrate on which a photoresist is coated (e.g., a wafer, a glass plate, or the like) via a projection optical system. Such an exposure apparatus includes a substrate stage that holds a substrate and is movable or an original stage that holds an original and is movable. In particular, in the substrate stage or the original stage with long stroke, a linear motor may be employed as a drive mechanism for generating a thrust force. If such a stage apparatus cannot perform normal operation due to some factors, action is taken to safely stop the stage by activating the dynamic brake (regenerative brake) within a linear motor. Japanese Patent Laid-Open No. 2001-85503 discloses a stage apparatus that safely stops a stage by activating a dynamic brake during a power failure.

In a stage apparatus which may be employed in a lithography apparatus, there is a stage apparatus having, for example, a coarse movement stage which operates (moves) with long stroke and a fine movement stage which enables fine adjustment such as precision positioning on the coarse movement stage, as a plurality of different movable units. There is also a stage apparatus having a main movable unit for holding a target object and a sub movable unit for supporting a mounting part such as wiring or a tube to the main movable unit as a plurality of different movable units.

Here, consider the case where the dynamic brake disclosed in Japanese Patent Laid-Open No. 2001-85503 is applied to a stage apparatus having such a plurality of movable units. For example, in the former stage apparatus, when the dynamic brake is activated upon high speed movement of the coarse movement stage, the coarse movement stage is decelerated sharply, resulting in a collision with a large shock between the coarse movement stage and the fine movement stage. The same applies to the case of the latter stage apparatus. Even when the main movable unit and the sub movable unit drive using the same linear motor the dynamic brake is activated, the braking force may not be the same due to a difference in mass or thrust force between the movable units. Consequently, the difference in relative speed between the movable units in the event of collision increases, so that the main movable unit may collide against the sub movable unit with a large shock. In contrast, it can also be contemplated that a braking force is designed to be extremely small so as to reduce the difference in relative speed between the movable units in the event of contact. If the braking force becomes small, the shock in the event of collision between the movable units can be reduced. However, although a shock absorber for mechanically receiving movable units is typically provided in a stage apparatus, a very long stroke is required to decelerate the movable units to a speed which can be handled by the shock absorption capability of the shock absorber. This may lead to an undesirable increase in size of the stage apparatus, which in turn results in an undesirable increase in size of the lithography apparatus in which the stage apparatus is employed.

SUMMARY OF THE INVENTION

The present invention provides, for example, a stage apparatus that is advantageous for suppressing the shock in the event of collision among a plurality of movable units upon activation of a dynamic brake and for reducing a stroke required until the movable units are stopped.

According to an aspect of the present invention, a lithography apparatus is provided that includes a first movable unit; a linear motor that includes a stator coil array arranged over a stroke range in a predetermined direction of the first movable unit and a mover magnet fixed to the first movable unit; a second movable unit that is arranged to face the first movable unit via a space and relatively moves with respect to the first movable unit in the predetermined direction; and a switch unit that forms a closed circuit including coils in the stator coil array and a resistance during operation of a dynamic brake, wherein a resistance value of the resistance connected to the coils in a closed circuit including a first coil located at a center region of the stroke range in the stator coil array is different from that in a closed circuit including a second coil located toward an end side of the stroke range rather than the center region in the stator coil array, and the resistance value of the resistance connected to the second coil is less than the resistance value of the resistance connected to the first coil.

According to another aspect of the present invention, a lithography apparatus is provided that includes a first movable unit; a linear motor that includes a stator coil array arranged over a stroke range in a predetermined direction of the first movable unit and a mover magnet fixed to the first movable unit; a second movable unit that is arranged to face the first movable unit via a space and relatively moves with respect to the first movable unit in the predetermined direction; and a switch unit that forms a closed circuit including coils in the stator coil array during operation of a dynamic brake, wherein a resistance value of a first coil located at a center region of the stroke range in the stator coil array is different from that of a second coil located toward an end side of the stroke range rather than the center region in the stator coil array, and the resistance value of the second coil is less than the resistance value of the first coil.

According to still another aspect of the present invention, a lithography apparatus is provided that includes a first movable unit; a linear motor that includes a stator coil array arranged over a stroke range in a predetermined direction of the first movable unit and a mover magnet fixed to the first movable unit; a second movable unit that is arranged to face the first movable unit via a space and relatively moves with respect to the first movable unit in the predetermined direction; and a switch unit that forms a closed circuit including coils in the stator coil array during operation of a dynamic brake, wherein self-inductance of a first coil located at a center region of the stroke range in the stator coil array is different from that of a second coil located toward an end side of the stroke range rather than the center region in the stator coil array, and the self-inductance of the second coil is less than the self-inductance of the first coil.

Further features of the present invention will become apparent from the following description of exemplary embodiments (with reference to the attached drawings).

DESCRIPTION OF THE EMBODIMENTS

Hereinafter, preferred embodiments of the present invention will be described with reference to the drawings.

First Embodiment

Figure 1:
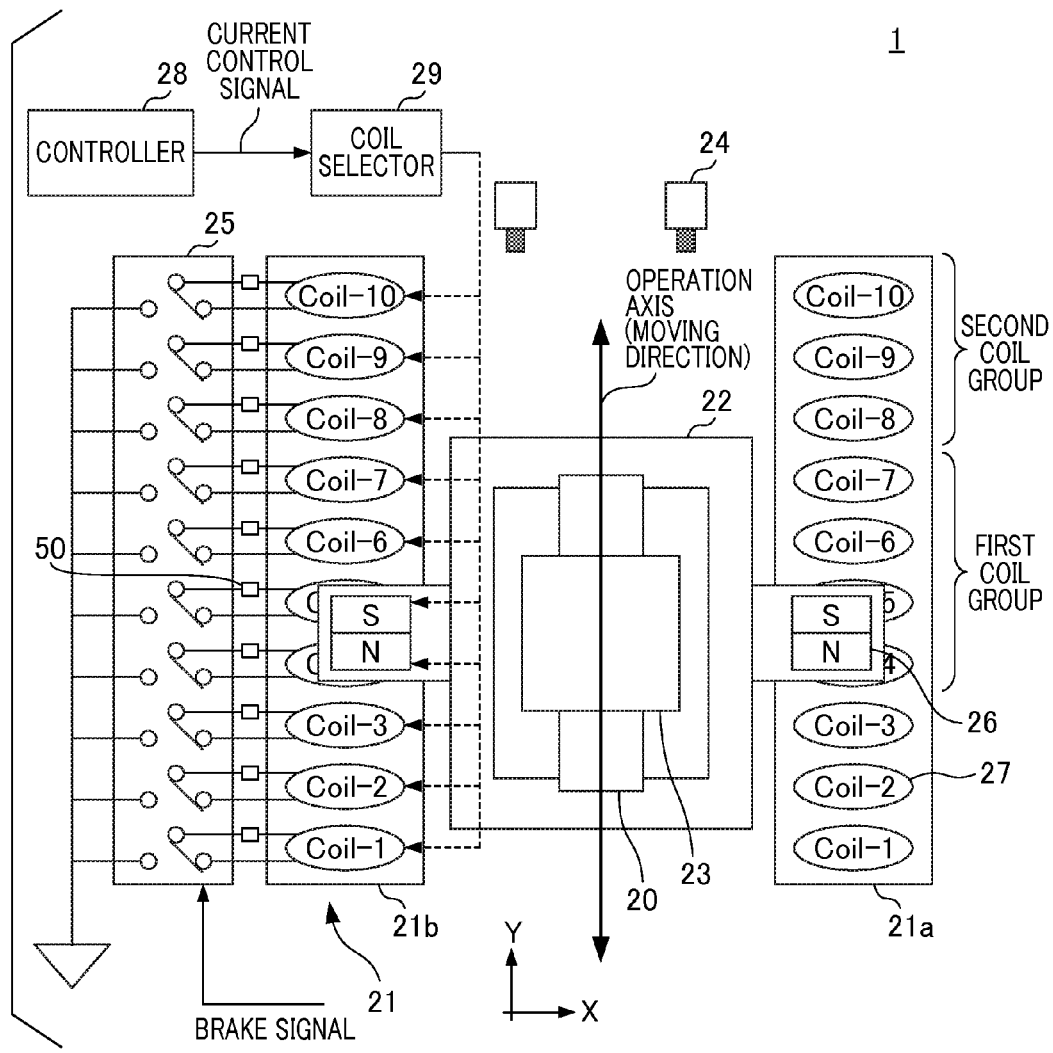
FIG. 1 illustrates a configuration of a stage apparatus according to a first embodiment of the present invention.

Firstly, a description will be given of a stage apparatus according to a first embodiment of the present invention. FIG. 1 is a schematic plan view illustrating a configuration of a stage apparatus 1 according to the present embodiment. The stage apparatus 1 includes a plurality of movable units, i.e., a coarse movable unit (first movable unit) 22 which is movable in a long stroke range by the driving of a linear motor (first linear motor) 21 and a fine movable unit (second movable unit) 23 which is relatively movable with respect to the coarse movable unit 22 on the coarse movable unit 22 (on the first movable unit). The fine movable unit 23 is arranged to face the coarse movable unit 22 via a space. The linear motor 21 includes two coil arrays (stator coil arrays) 21a and 21b which are extended to move the coarse movable unit 22 in the Y axis direction (predetermined direction). In other words, the coil arrays 21a and 21b are arranged over the stroke range of the coarse movable unit 22. Each of the coil arrays 21a and 21b has a plurality of coils 27. For ease of explanation, it is assumed that ten coils ("Coil-1" to "Coil-10") are arrayed in each of the coil arrays 21a and 21b shown in FIG. 1. On the other hand, magnets (mover magnets) 26 which are arranged opposite to (to face) the coil arrays 21a and 21b, respectively, and are movable thereon are secured to the coarse movable unit 22. As described above, the linear motor 21 is so-called a "multi-phase linear motor" which is composed of the plurality of coils 27 and the magnets 26. The magnet 26 has N-pole and S-pole. The Lorentz force is generated by passing a current through the coils 27 facing the magnets 26 to thereby obtain a thrust force. This allows the coarse movable unit 22 to move along the operation axis (the Y axis) between the coil array 21a and the coil array 21b. A positioning target object (not shown) is mounted on the fine movable unit 23. The fine movable unit 23 is movable independent of the operation of the coarse movable unit 22 along the same operation axis as that of the linear motor 21 by the driving of a linear motor (second linear motor) 20. In other words, the fine movable unit 23 relatively moves with respect to the coarse movable unit 22 in the Y axis direction. With the aid of fine movement, the fine movable unit 23 can perform fine adjustment for the precision positioning of a target object to be positioned on the coarse movable unit 22. The fine movable unit 23 may also be movable in other directions such as the X axis direction in addition to the Y axis direction.

The stage apparatus 1 also includes a shock absorber 24. The shock absorber 24 is a shock absorption member that is installed at the end (stroke end) of the stroke range of the coarse movable unit 22. At the occurrence of abnormal operations (hereinafter simply referred to as "upon emergency") such as an unintentional failure to stop of the coarse movable unit 22, the shock absorber 24 mechanically receives the coarse movable unit 22 itself to completely stop it. As an example of the shock absorber 24, FIG. 1 only illustrates the shock absorber 24 which is installed at the positive side in the Y axis direction such that the shock absorber 24 may receive the coarse movable unit 22 in accordance with the moving direction (movement towards the positive side in the Y axis direction), and the shock absorber 24 is also actually installed at the negative side in the Y axis direction.

Furthermore, the stage apparatus 1 includes a controller 28, a coil selector 29, and a switch unit 25. The controller 28 controls driving of the linear motor 21. Firstly, the controller 28 controls a current supply to a plurality of coils 27 to adjust the moving direction and the speed of movement of the coarse movable unit 22. The coil selector 29 selects a coil 27 to which a current is supplied, and supplies a current to the selected coil corresponding to a current control signal. The switch unit 25 includes a contact group. The contact group is connected to the coils 27 and includes a plurality of contacts for receiving a brake signal from the controller 28 upon activation of a dynamic brake (regenerative brake) to be described below to switch a current circuit including the coils 27 from an open circuit to a closed circuit.

Figure 6:
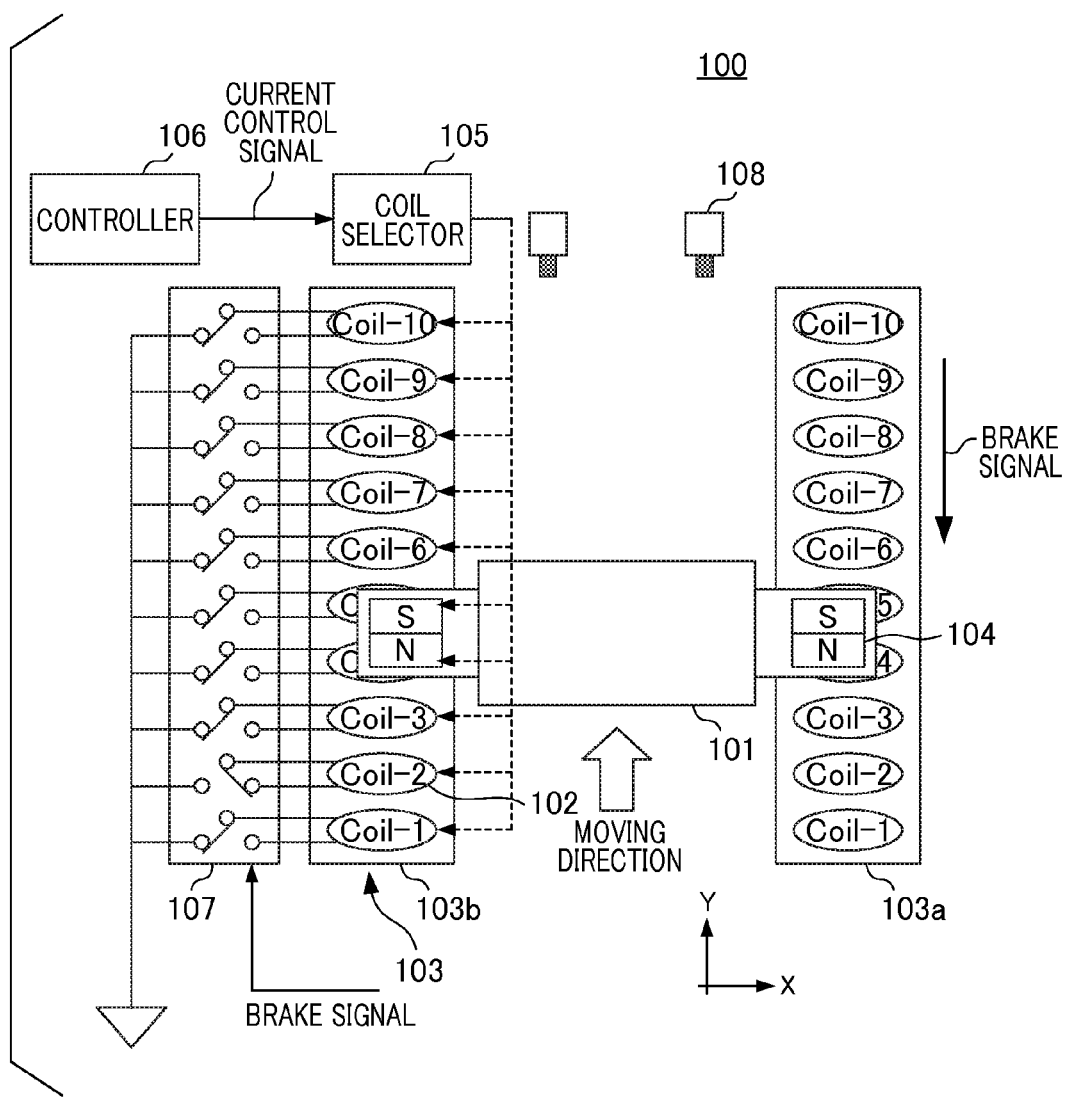
FIG. 6 illustrates a configuration of a stage apparatus to which the present invention is not applied.

Next, a description will be given of the dynamic brake operation performed by the stage apparatus 1 upon emergency. Firstly, in order to clarify the feature of the dynamic brake operation in the present embodiment, a description will be given of the principle of the dynamic brake operation for comparison. FIG. 6 is a schematic plan view illustrating a configuration of the stage apparatus 100 to which the present invention is not applied. The stage apparatus 100 includes only one movable unit 101 and further includes a linear motor 103 including two coil arrays 103a and 103b in which the coils 102 are arranged in the same array as that in the present embodiment and magnets 104 secured to the movable unit 101. The stage apparatus 100 also includes a coil selector 105, a controller 106, and a switch unit 107. In this configuration, upon normal operation of the stage apparatus 100, the controller 106 firstly transmits a current control signal to the coil selector 105. Then, the coil selector 105 supplies current to the selected coils 102 (in the example shown in FIG. 6, "Coil-4" in each of the coil arrays 103a and 103b). The Lorentz force is generated in succession by switching the current supply to the coils 102 as described above, so that the movable unit 101 to which the magnets 104 is secured moves in the direction of the arrow shown in FIG. 6. Note that all the contacts included in the switch unit 107 are open upon normal operation.

In contrast, upon emergency, the controller 106 transmits a brake signal to the switch unit 107 to close an electrical circuit (form a closed circuit) including a specific coil "Coil-n" (n is any number from 1 to 10). If the movable unit 101 attempts to move continuously in this state, an induced electromotive force is generated in the closed circuit including the coil 102 by which the contact is closed. The induced electromotive force causes current to flow in a direction to impede the movement of the movable unit 101, a braking force is generated for the movable unit 101. If the same closed circuit as described above is formed on all the coils 102, the speed of movement of the movable unit 101 is reduced by a braking force from the coils 102 on which the movable unit 101 passes through sequentially. Finally, the movable unit 101 is completely stopped by its contact with the shock absorber 108.

However, assume that such a dynamic brake is applied to a stage apparatus having a coarse movable unit and a fine movable unit. When a dynamic brake is operated when the speed of the coarse movable unit is large (e.g., when the coarse movable unit moves at the center region of the stroke range), the coarse movable unit is decelerated sharply, resulting in an undesirable large shock collision between the coarse movable unit and the fine movable unit. Accordingly, in the stage apparatus 1, the resistance value or the self-inductance for each of a plurality of coils 27 is set in advance as follows.

Figure 2:
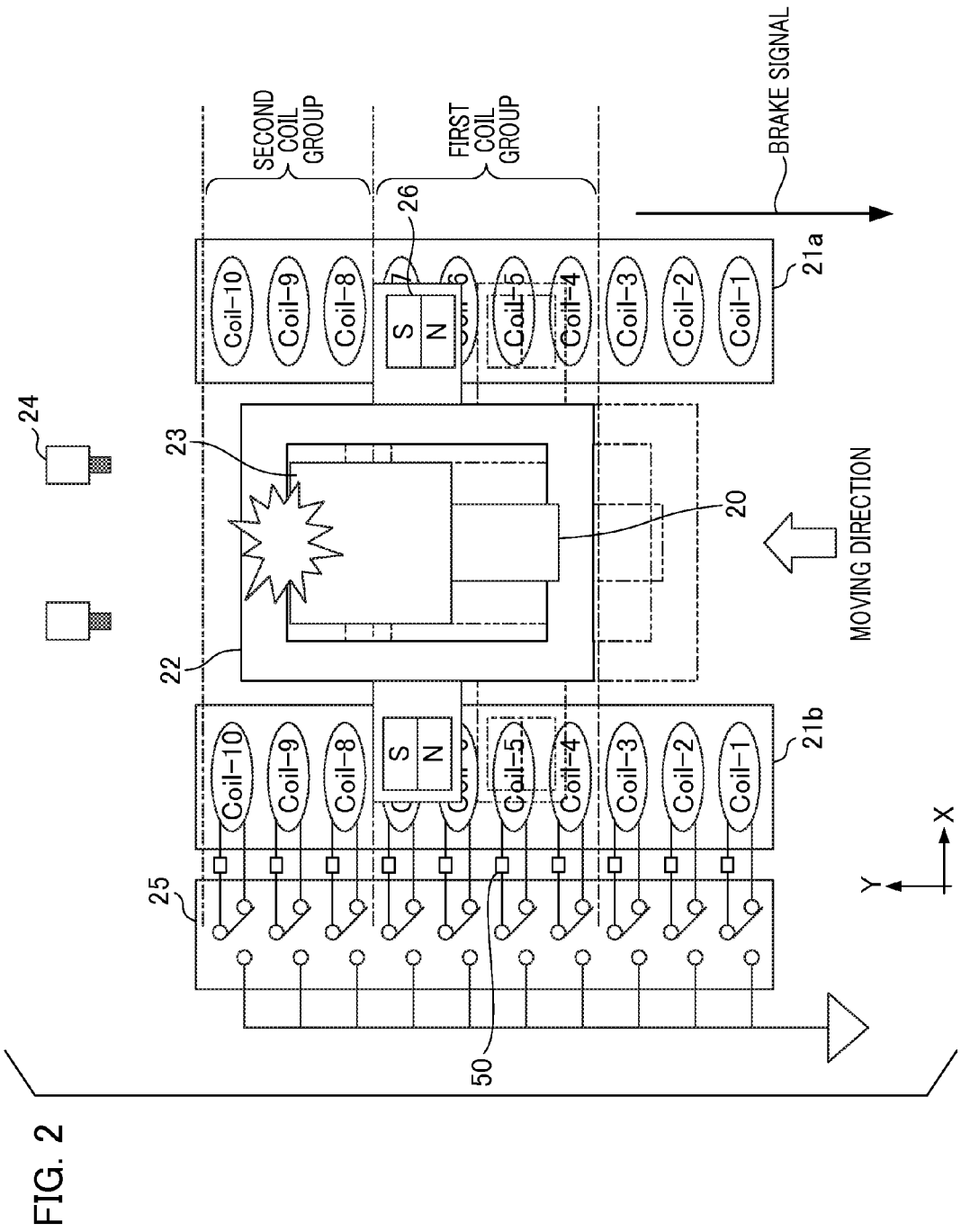
FIG. 2 illustrates a stage apparatus upon occurrence of a braking force according to the first embodiment.

FIG. 2 is a schematic plan view illustrating the state where a braking force is generated by the activation of the dynamic brake in the stage apparatus 1. Here, assume that the dynamic brake is activated while the coarse movable unit 22 moves in the direction of the arrow shown in FIG. 2. Firstly, the controller 28 sets each of the electrical circuits including the coils 27 to a closed circuit. At this time, the braking force is exerted on the coarse movable unit 22 which is in the position shown in dotted lines in FIG. 2 in the direction of the arrow shown in FIG. 2, resulting in a difference in relative speed between the coarse movable unit 22 at this time and the fine movable unit 23 which is in the position shown in dotted lines in FIG. 2. With respect to the activation position of the dynamic brake shown in dotted lines, the movable units 22 and 23 shown in solid lines are at the position at which the coarse movable unit 22 contacts with the fine movable unit 23 on the operation axis in the stroke range. In order to reduce a difference in relative speed upon contact between the coarse movable unit 22 and the fine movable unit 23 in the stroke range to the contact position, it is preferable that the braking force exerted on the coarse movable unit 22 is suppressed. Here, the braking force at a certain time t after activation of the dynamic brake is represented by the relationship: braking force=induced current (t)×thrust force constant of the linear motor 21. The induced current is represented by the following Formula (1).

[Equation 1]

$$\text{Induced current } (t) = \frac{V}{R_1} \times \left(1 - e^{\left(-\frac{R_1}{L_1}t\right)}\right) \quad (1)$$

where V represents a counter electromotive voltage (hereinafter same as above), $R_1$ represents a resistance value of each of the coils 27 which are arranged in the range prior to contact between the coarse movable unit 22 and the fine movable unit 23, and $L_1$ represents the self-inductance of each of the coils 27. Here, a group of specific coils 27 in the range is defined as a "first coil group", and four coils, i.e., "Coil-4" to "Coil-7" are included in the first coil group (first coil) (see FIGS. 1 and 2). In the present embodiment, in order to suppress the braking force, at least any one of the resistance value $R_1$ and the self-inductance $L_1$ of the coils 27 belonging to the first coil group is set to be larger than that of the coils 27 other than specified. With this arrangement, the difference in relative speed is reduced, so that the shock caused by the contact can be within an allowable value for the movable units 22 and 23. Here, the term "allowable value" refers to a value which satisfies various conditions such as no damage caused by a contact between the movable units or no positional shift or fall of the target object to be positioned that is mounted on the fine movable unit 23 and may be specified in advance by an experiment.

On the other hand, in the stroke range after the contact position, it is preferable that the braking force exerted on the coarse movable unit 22 is as large as possible in order to decelerate the coarse movable unit 22 and the fine movable unit 23 in a short interval after contact therebetween. Here, the braking force at a certain time t after contact is represented by the relationship: braking force=induced current (t)×thrust force constant of the linear motor 21 as in the above example. The induced current is represented by the following Formula (2).

[Equation 2]

$$\text{Induced current } (t) = \frac{V}{R_2} \times \left(1 - e^{\left(-\frac{R_2}{L_2}t\right)}\right) \quad (2)$$

where $R_2$ represents a resistance value of each of the coils 27 which are arranged in the range after contact between the coarse movable unit 22 and the fine movable unit 23, and $L_2$ represents the self-inductance of each of the coils 27. Here, a group of specific coils 27 in the range is defined as a "second coil group" (second coil), and three coils, i.e., "Coil-8" to "Coil-10" are included in the second coil group (see FIGS. 1 and 2). In the present embodiment, at least any one of the resistance value $R_2$ and the self-inductance $L_2$ of the coils 27 belonging to the second coil group is set to be smaller than that of the coils 27 other than specified. With this arrangement, the induced current increases, resulting in an increase in braking force exerted on the coarse movable unit 22. Thus, when the coarse movable unit 22 collides against the shock absorber 24, the coarse movable unit 22 can be decelerated to a speed which may be allowable by the shock absorption capability of the shock absorber 24 without enlarging (prolonging) the stroke range. At this time, the resistance values $R_1$ and $R_2$ and the self-inductances $L_1$ and $L_2$ of the coils satisfy the relationship of at least $L_1 > L_2$ and $R_1 > R_2$ in order to provide the effects as described above.

Next, a description will be given of a method for determining the resistance value or the self-inductance of each of the coils 27 included in the first coil group or the second coil group and a configuration for setting the resistance value or the self-inductance of each of the coils 27 to the determined resistance value or self-inductance. The resistance value and the self-inductance of each of the coils 27 are determined based on at least any one of a difference in relative speed between the coarse movable unit 22 and the fine movable unit 23, i.e., the respective speeds of the same and the distance between the movable units 22 and 23. These speeds and the distance may be determined by calculation from the design by taking into consideration of the limitation on size of the stage apparatus 1, the stroke specification, and the like or may also be directly measured by various measurement devices to determine allowable values from the actual measured values.

The resistance value of a coil typically depends on the thickness of the conducting wire constituting the coil. On the other hand, the self-inductance of a coil typically depends on the number of turns of the conducting wire constituting the coil. Thus, as a configuration for changing the resistance value or the self-inductance of each of the coils 27, the thickness of or the number of turns of the conducting wire of each of the coils 27 may be directly changed to be arranged in the coil arrays 21a and 21b.

In the above embodiment, it is assumed that all the resistance values of the resistances 50 included in the closed circuits are the same. However, considerable time and labor are required for adjustment, assembling, and the like in order to actually change the thickness of or the number of turns of the conducting wire of each of the coils 27. As a variant example of the embodiment, the conducting wire of the coils 27 may have the same thickness or the same number of turns such that the resistance values of the resistances 50 included in the closed circuits are different from each other. In other words, the resistance value of the resistance 50 (second resistance) in a closed circuit including the second coil group is set to be smaller than the resistance value of the resistance 50 (first resistance) in a closed circuit including the first coil group. In this manner, as in the case where the resistance values or the self-inductances of the coils 27 are changed, the shock in the event of collision between the coarse movable unit 22 and the fine movable unit 23 can be suppressed upon activation of a dynamic brake and the movement distance required until the movable units are stopped can be reduced. For example, a ceramic resistance may be used as the resistance 50. For example, the resistance value of the resistance 50 connected to the first coil group may be 10 times greater than the resistance value of the resistance 50 connected to the second coil group.

As described above, although the stage apparatus 1 includes a plurality of movable units 22 and 23 which move along the same operation axis, a shock which may be caused by the contact between the movable units 22 and 23 may be suppressed to be an allowable level if by any chance the movable units 22 and 23 contact with each other upon activation of a dynamic brake. On the other hand, it is also contemplated that a difference in relative speed between the movable units 22 and 23 is made small by designing a braking force to be extremely small so as not to cause a difference in braking force therebetween. However, when the braking force becomes small, the shock in the event of contact between the movable units 22 and 23 can be reduced but a very long stroke is required to decelerate the movable units 22 and 23 to a speed which can be handled by the shock absorption capability of the shock absorber 24. In contrast, in the present embodiment, the stage apparatus 1 does not enlarge the stroke range required until the coarse movable unit 22 is decelerated to the allowable speed of the shock absorber 24 from the contact position of the movable units 22 and 23. Thus, the safety and reliability can be maintained while avoiding an increase in size of the entire apparatus.

As described above, according to the present embodiment, a stage apparatus that is advantageous for suppressing the shock in the event of collision among a plurality of movable units upon activation of a dynamic brake and for reducing a stroke required until the movable units are stopped may be provided.

While, in the present embodiment, a description has been given on the assumption that the moving direction of the coarse movable unit 22 is the positive side in the Y axis direction, the configuration of the stage apparatus 1 is also compatible with the case where the moving direction of the coarse movable unit 22 is the negative side in the Y axis direction. In this case, as the first and second coil groups, four coils are assigned to the first coil group as in the above description but three coils, i.e., "Coil-1" to "Coil-3" are assigned to the second coil group.

The number and arrangement of the first coil groups and the second coil groups may be changed as appropriate. In the stage apparatus for reciprocating the scan driving, the coarse movable unit 22 normally reaches its maximum speed at the center region of the stroke range. Thus, it is preferable that the coils located at the center region of the stroke range are set to the first coil group and the coils located toward the end side of the stroke range rather than the center region are set to the second coil group. While, in the above embodiment, two coil groups, i.e., the first coil group and the second coil group are provided, three or more coil groups may also be provided.

Second Embodiment

Next, a description will be given of a stage apparatus according to a second embodiment of the present invention. The stage apparatus 1 according to the above embodiment has a plurality of movable units which are arranged on the same operation axis and move by the driving of the same linear motor 21, where the plurality of movable units are the coarse movable unit 22 and the fine movable unit 23 placed on the coarse movable unit 22. In contrast, in the stage apparatus according to the present embodiment, all the plurality of movable units has magnets for a plurality of coils of the coil arrangements so as to be independently movable on the coil arrays.

Figure 3:
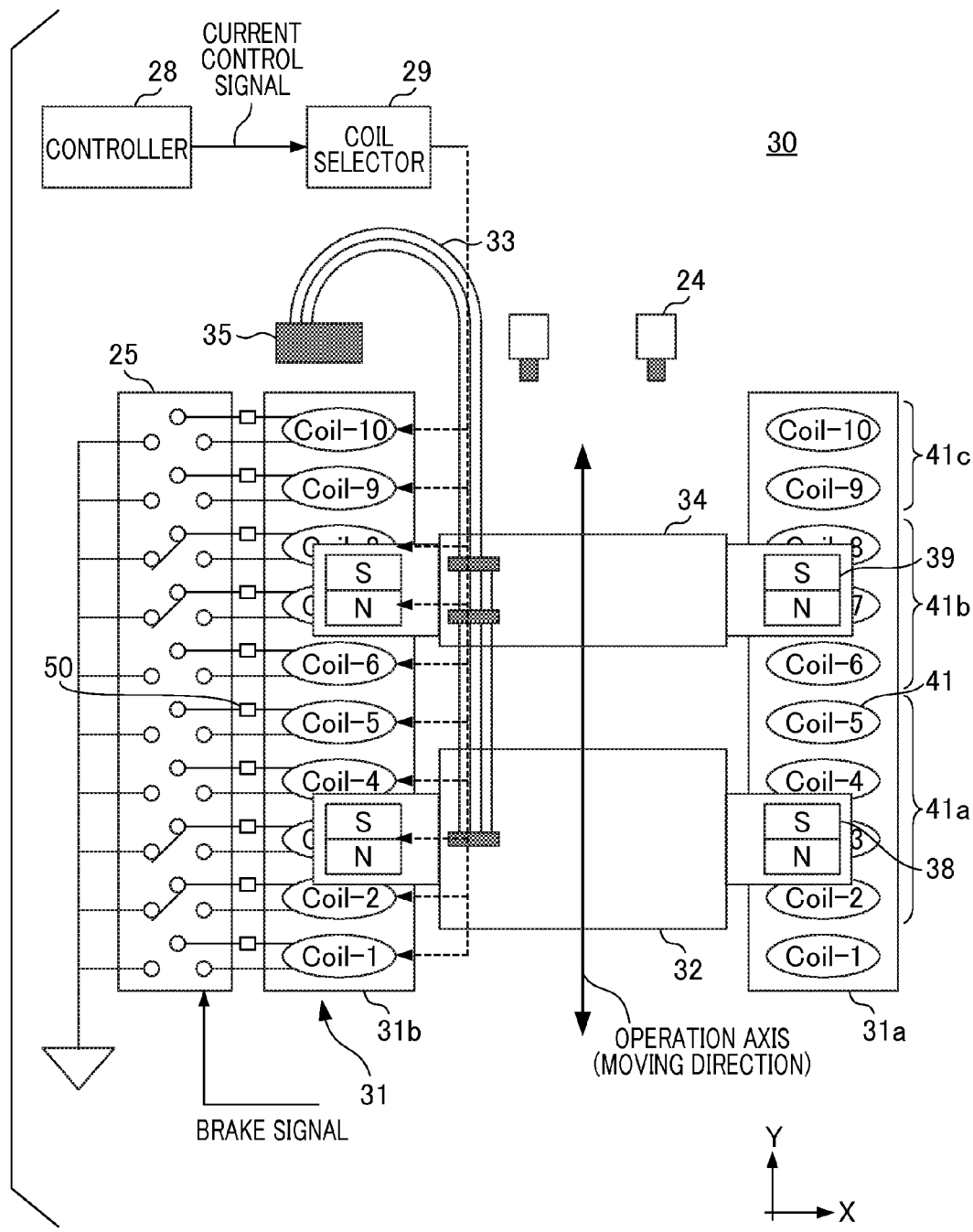
FIG. 3 illustrates a configuration of a stage apparatus according to a second embodiment of the present invention.

FIG. 3 is a schematic plan view illustrating a configuration of a stage apparatus 30 according to the present embodiment. Note that the same components as those of the stage apparatus 1 according to the first embodiment shown in FIG. 1 are designated by the same reference numerals, and thus, description thereof will be omitted. The stage apparatus 30 includes a main movable unit (first movable unit) 32 which is movable while mounting thereon a target object to be positioned by the driving of a linear motor 31 and a sub movable unit (second movable unit) 34 which moves independently from the main movable unit 32. The main movable unit 32 carries a mounting member (utility component) 33 such as a cable for transmitting electricity and extending from the controller 28, a tube for cooling and extending from a cooling device, or the like. In FIG. 3, the controller 28 or the cooling device which is the component connected to the mounting member 33 is represented by a block designated by reference numeral 35. The sub movable unit 34 is arranged to be adjacent to the main movable unit 32 and to be movable at a position for receiving disturbances in front of the main movable unit 32 such that the disturbances provided via the mounting member 33 are prevented from being directly transferred to the main movable unit 32. The linear motor 31 includes two coil arrays 31a and 31b which are extended to move the main movable unit 32 and the sub movable unit 34 in one direction (the Y axis direction in the example shown in FIG. 3). A plurality of (10 in the example shown in FIG. 3) coils (stator coil array) 41 is arranged in each of the coil arrays 31a and 31b. On the other hand, the main movable unit 32 is provided with magnets (mover magnets) 38 which are respectively movable on the coil arrays 31a and 31b. Likewise, the sub movable unit 34 is provided with magnets (mover magnets) 39 which are respectively movable on the coil arrays 31a and 31b. As described above, the linear motor 31 is so-called a "multi-phase linear motor" which is composed of the plurality of coils 41 and the magnets 38 and 39. Each of the magnets 38 and 39 has N-pole and S-pole. The Lorentz force is generated by passing a current through the coils 41 facing the magnets 38 and 39 to thereby obtain a thrust force. This allows the main movable unit 32 and the sub movable unit 34 to move along the operation axis (the Y axis) between the coil array 31a and the coil array 31b.

Figure 4:
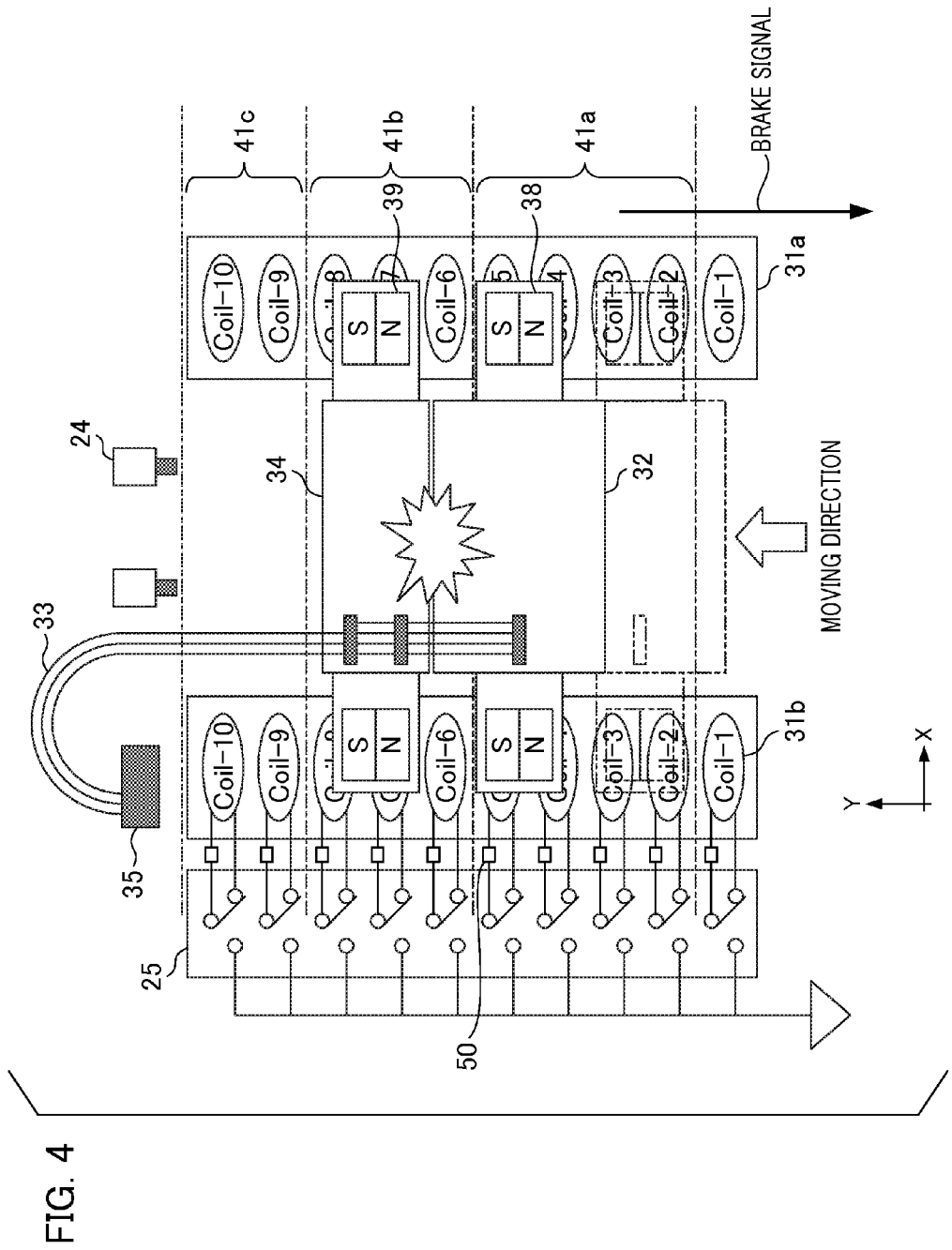
FIG. 4 illustrates a stage apparatus upon occurrence of a braking force according to the second embodiment.

FIG. 4 is a schematic plan view illustrating the state where a braking force is generated by the activation of the dynamic brake in the stage apparatus 30. Here, assume that the dynamic brake is activated due to the occurrence of an abnormal operation during movement of the main movable unit 32 in the direction of the arrow shown in FIG. 4. Firstly, the controller 28 forms a closed circuit to each coil included in the coils 41. At this time, the braking force is exerted on the main movable unit 32 and the sub movable unit 34 which are in the position shown in dotted lines in FIG. 4 in the direction of the arrow shown in FIG. 4, resulting in a difference in brake acceleration between the main movable unit 32 and the sub movable unit 34 at this time due to the difference in mass between the movable units 32 and 34. With respect to the activation position of the dynamic brake shown in dotted lines, the movable units 32 and 34 shown in solid lines are at the position at which the main movable unit 32 contacts with the sub movable unit 34 on the operation axis in the stroke range. Here, the mass of the main movable unit 32 is $m_1$. In this case, the brake acceleration of the main movable unit 32 at a certain time t after activation of the dynamic brake is represented by the relationship: brake acceleration $a_1$=(induced current (t)×thrust force constant of the linear motor 31)/$m_1$. The induced current is represented by the following Formula (3).

[Equation 3]

$$\text{Induced current } (t) = \frac{V}{R_3} \times \left(1 - e^{\left(-\frac{R_3}{L_3}t\right)}\right) \quad (3)$$

On the other hand, the mass of the sub movable unit 34 is $m_2$. In this case, the brake acceleration of the sub movable unit 34 at a certain time t after activation of the dynamic brake is represented by the relationship: brake acceleration $a_2$=(induced current (t)×thrust force constant of the linear motor 31)/$m_2$. The induced current is represented by the following Formula (4).

[Equation 4]

$$\text{Induced current } (t) = \frac{V}{R_4} \times \left(1 - e^{\left(-\frac{R_4}{L_4}t\right)}\right) \quad (4)$$

Here, assume that the masses $m_1$ and $m_2$ are in a relationship of $m_1 > m_2$ and the induced current caused by the main movable unit 32 is the same as the induced current caused by the sub movable unit 34. In this case, the relationship of (the brake acceleration of the main movable unit 32)<(the brake acceleration of the sub movable unit 34) is obtained by Formulae (3) and (4), so that the sub movable unit 34 is decelerated faster than the main movable unit 32. Accordingly, in the present embodiment, in the stroke range until the main movable unit 32 collides against the sub movable unit 34, the resistance value $R_3$ or the self-inductance $L_3$ of the coils in a coil group 41a on which the magnets 38 of the main movable unit 32 which is heavier than the sub movable unit 34 pass through is set to be small. In the example shown in FIG. 4, four coils, i.e., "Coil-2" to "Coil-5" are included in the coil group 41a. On the other hand, the resistance value $R_4$ or the self-inductance $L_4$ of the coils in a coil group 41b on which the magnets 39 of the sub movable unit 34 which is lighter than the main movable unit 32 pass through is set to be small. In the example shown in FIG. 4, three coils, i.e., "Coil-6" to "Coil-8" are included in the coil group 41b. With this arrangement, a difference in braking force between the main movable unit 32 and the sub movable unit 34 is reduced, so that the shock caused by the contact can be within an allowable value by the movable units 32 and 34. At this time, the resistance values $R_3$ and $R_4$ and the self-inductances $L_3$ and $L_3$ of the coils satisfy the relationship of at least $L_3 < L_4$ and $R_3 < R_4$ in order to provide the effects as described above.

Next, in order to decelerate the main movable unit 32 and the sub movable unit 34 in a short interval in the stroke range after collision between the main movable unit 32 and the sub movable unit 34, the resistance value $R_5$ or the self-inductance $L_5$ of the coils in a coil group 41c on which the magnets 39 of the sub movable unit 34 pass through after collision is set to be small. In the example shown in FIG. 4, two coils, i.e., "Coil-9" and "Coil-10" are included in the coil group 41c. With this arrangement, the induced current increases, resulting in an increase in braking force exerted on the movable units 32 and 34. Thus, when the sub movable unit 34 collides against the shock absorber 24, the sub movable unit 34 can be decelerated to a speed which may be allowable by the shock absorption capability of the shock absorber 24 without enlarging (prolonging) the stroke range. At this time, the resistance values $R_4$ and $R_4$ and the self-inductances $L_4$ and $L_4$ of the coils satisfy the relationship of at least $L_4 > L_5$ and $R_4 > R_5$ in order to provide the effects as described above. Here, when the concept of the first coil group and the second coil group is introduced in the present embodiment as in the description in the first embodiment, a collection of the coil group 41a and the coil group 41b is defined as the first coil group and the coil group 41c is defined as the second coil group.

As described above, according to the present embodiment, the same effects as those in the first embodiment are provided even if the configuration of a plurality of movable units included in the stage apparatus is different from that in the first embodiment. The variant example of the first embodiment is also similarly applicable to the present embodiment.

Note that the multi-phase linear motor emerged in the description in the above embodiments may be a 3-phase linear motor or may also be a 2-phase linear motor and the method for controlling a current for driving a linear motor is also not limited to the above embodiments.

Lithography Apparatus

Figure 5:
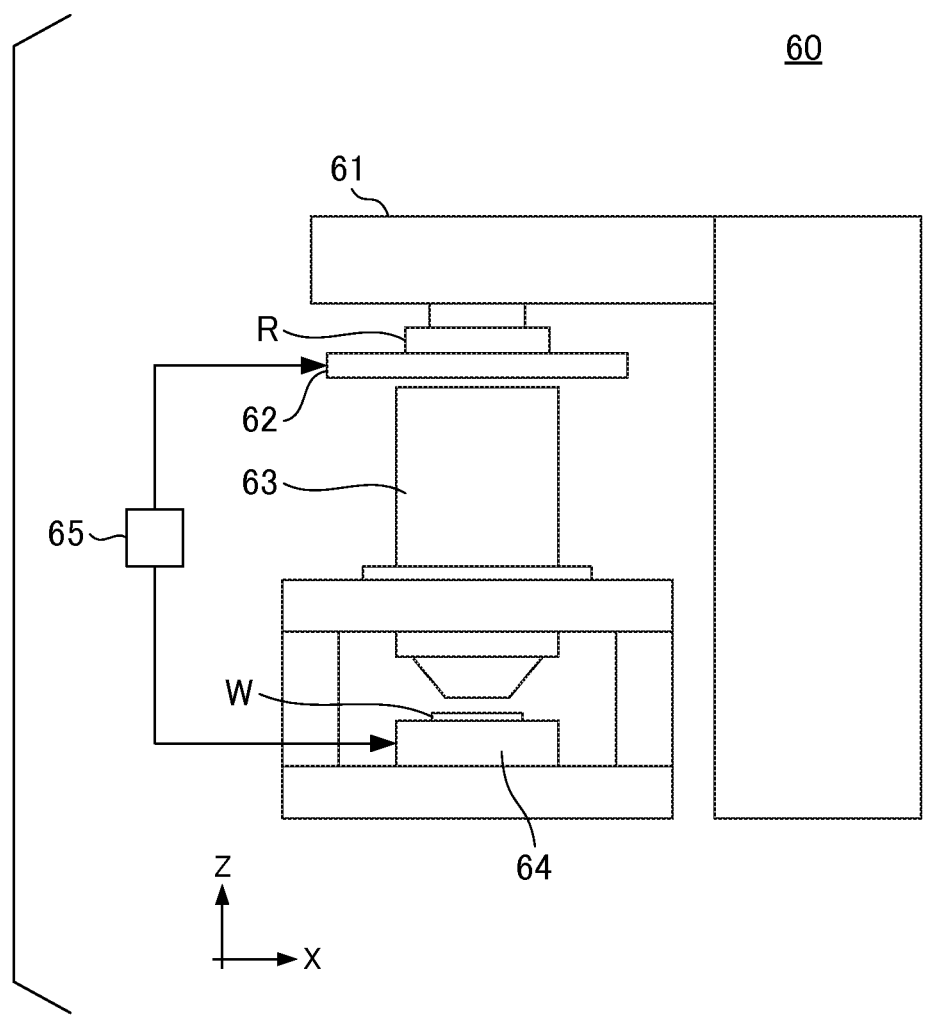
FIG. 5 illustrates a configuration of an exposure apparatus including a stage apparatus according to one embodiment.

Next, a description will be given of a lithography apparatus according to one embodiment of the present invention. Hereinafter, a description will be given by taking an example of the lithography apparatus according to the present embodiment as an exposure apparatus. FIG. 5 is a schematic view illustrating a configuration of an exposure apparatus 60 according to the present embodiment. As an example, the exposure apparatus 60 is a projection type exposure apparatus that is used in manufacturing steps of a semiconductor device and exposes (transfers) a pattern formed on a reticle R onto a wafer W (substrate) by a step-and-repeat method or a step-and-scan method. The exposure apparatus 60 includes an illumination system 61, a reticle stage 62 for holding the reticle R, a projection optical system 63, a wafer stage 64 for holding the wafer W, and a controller 65. In FIG. 5, the Z axis is aligned parallel to the optical axis (in the present embodiment, vertical direction) of the projection optical system 63, the X axis is aligned in the scanning direction of the wafer W during exposure within a plane perpendicular to the Z axis, and the Y axis is aligned in the non-scanning direction perpendicular to the X axis.

The illumination system 61 irradiates the reticle R with light by adjusting the light emitted from a light source (not shown). The reticle R is, for example, an original made of quartz glass. A pattern (e.g., circuit pattern) to be transferred onto the wafer W is formed on the reticle R. The reticle stage 62 is movable in the XY-axis directions while holding the reticle R. The projection optical system 63 projects an image of the pattern on the reticle R, which has been illuminated with light from the illumination system 61, onto the wafer W with a predetermined magnification (e.g., ½ to ⅕). The wafer W is a substrate made of, for example, single crystal silicon. A resist (photoresist) is coated on the surface of the wafer W. The wafer stage 64 is movable in the XYZ-axis directions while holding the wafer W via a chuck (not shown). The controller 65 is constituted, for example, by a computer or the like and is connected to the components of the exposure apparatus 60 via a line to thereby execute control of the components in accordance with a program or the like.

In the exposure apparatus 60 according to the present embodiment, the stage apparatus described in the above embodiments may be employed as the reticle stage 62 or the wafer stage 64. This particularly enables an improvement in safety and reliability of the exposure apparatus 60. In this case, the controller 28 in the stage apparatus described in the above embodiments may be integrated with or may also be provided separately from the controller 65 of the exposure apparatus 60. The controller 65 itself may be integrated with the rest of the exposure apparatus 60 (provided in a shared housing) or may also be provided separately from the rest of the exposure apparatus (provided in a separate housing).

While a description has been given of an exposure apparatus as a lithography apparatus, the lithography apparatus of the present embodiment is not limited thereto but may also be another lithography apparatus. For example, the lithography apparatus may also be a lithography apparatus that performs drawing on a substrate (a photoresist coated on the substrate) with a charged particle beam such as an electron beam or may also be an imprint apparatus that forms (molds) an imprint material on a substrate using a mold to thereby form a pattern on the substrate.

Article Manufacturing Method

An article manufacturing method according to an embodiment of the present invention is preferred in manufacturing an article such as a micro device such as a semiconductor device or the like, an element or the like having a microstructure, or the like. The article manufacturing method may include a step of forming a pattern (e.g., latent image pattern) on an object (e.g., substrate on which a photosensitive material is coated) using the aforementioned lithography apparatus; and a step of processing (e.g., step of developing) the object on which the latent image pattern has been formed in the previous step. Furthermore, the article manufacturing method may include other known steps (oxidizing, film forming, vapor depositing, doping, flattening, etching, resist peeling, dicing, bonding, packaging, and the like). The device manufacturing method of this embodiment has an advantage, as compared with a conventional device manufacturing method, in at least one of performance, quality, productivity and production cost of a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-215359 filed on Oct. 16, 2013, and Japanese Patent Application No. 2014-208234 filed on Oct. 9, 2014, which are hereby incorporated by reference herein in their entirety.

What is claimed is:

1. A stage apparatus comprising:
   a first movable unit;
   a linear motor that includes a stator coil array arranged over a stroke range in a predetermined direction of the first movable unit and a mover magnet fixed to the first movable unit, the mover magnet opposing the stator coil array;
   a second movable unit that is arranged to face the first movable unit via a space and relatively moves with respect to the first movable unit in the predetermined direction; and
   a switch unit configured to form a first closed circuit and a second closed circuit to generate a braking force for the first movable unit during operation of a dynamic brake, the first closed circuit including a first coil located in a center region of the stator coil array and a first resistance connected to the first coil, the second closed circuit including a second coil located in a region, which is other than the center region, of the stator coil array and a second resistance connected to the second coil,
   wherein an electrical resistance value of the second resistance is less than an electrical resistance value of the first resistance, and
   wherein the mover magnet opposes the second coil after the first movable unit and the second movable unit are in contact during operation of the dynamic brake.

2. The stage apparatus according to claim 1, wherein the linear motor is a first linear motor, and the stage apparatus further comprises:
   a second linear motor that includes a stator fixed to the first movable unit and a mover fixed to the second movable unit and moves the second movable unit in the predetermined direction.

3. The stage apparatus according to claim 1, wherein the linear motor further comprises a mover magnet fixed to the second movable unit and opposing the stator coil array.

4. The stage apparatus according to claim 1, wherein a brake acceleration of the first movable unit is less than a brake acceleration of the second movable unit during operation of the dynamic brake.

5. The stage apparatus according to claim 1, wherein the second movable unit is arranged above the first movable unit.

6. The stage apparatus according to claim 1, wherein the second movable unit is arranged along the stroke range and is arranged to be adjacent to the first movable unit and configured to carry a utility component connected to the first movable unit.

7. The stage apparatus according to claim 1, further comprising a shock absorber provided at an end of the stroke range and configured to absorb shock after the mover magnet opposes the second coil.

8. The stage apparatus according to claim 1, wherein the first movable unit and the second movable unit are in contact after a timing where the mover magnet opposes the first coil.

9. A stage apparatus comprising:
a first movable unit;
a linear motor that includes a stator coil array arranged over a stroke range in a predetermined direction of the first movable unit and a mover magnet fixed to the first movable unit, the mover magnet opposing the stator coil array;
a second movable unit that is arranged to face the first movable unit via a space and relatively moves with respect to the first movable unit in the predetermined direction; and
a switch unit configured to form a first closed circuit and a second closed circuit to generate a braking force for the first movable unit during operation of a dynamic brake, the first closed circuit including a first coil located in a center region of the stator coil array, the second closed circuit including a second coil located in a region, which is other than the center region, of the stator coil array,
wherein an electrical resistance value of the second coil is less than an electrical resistance value of the first coil, and
wherein the mover magnet opposes the second coil after the first movable unit and the second movable unit are in contact during operation of the dynamic brake.

10. The stage apparatus according to claim 9, wherein the linear motor is a first linear motor, and the stage apparatus further comprises:
a second linear motor that includes a stator fixed to the first movable unit and a mover fixed to the second movable unit and moves the second movable unit in the predetermined direction.

11. The stage apparatus according to claim 9, wherein the linear motor further comprises a mover magnet fixed to the second movable unit.

12. The stage apparatus according to claim 9, wherein a brake acceleration of the first movable unit is less than a brake acceleration of the second movable unit during operation of the dynamic brake.

13. The stage apparatus according to claim 9, wherein a thickness of a conducting wire constituting the second coil is thinner than that of a conducting wire constituting the first coil.

14. The stage apparatus according to claim 9, wherein the second movable unit is arranged above the first movable unit.

15. The stage apparatus according to claim 9, wherein the second movable unit is arranged along the stroke range and is arranged to be adjacent to the first movable unit and configured to carry a utility component connected to the first movable unit.

16. The stage apparatus according to claim 9, further comprising a shock absorber provided at an end of the stroke range and configured to absorb shock after the mover magnet opposes the second coil.

17. The stage apparatus according to claim 9, wherein the first movable unit and the second movable unit are in contact after a timing where the mover magnet opposes the first coil.

18. A lithography apparatus which forms a pattern on a substrate, the apparatus comprising:
a stage apparatus configured to move the substrate,
wherein the stage apparatus including:
a first movable unit;
a linear motor that includes a stator coil array arranged over a stroke range in a predetermined direction of the first movable unit and a mover magnet fixed to the first movable unit, the mover magnet opposing the stator coil array;
a second movable unit that is arranged to face the first movable unit via a space and relatively moves with respect to the first movable unit in the predetermined direction; and
a switch unit configured to form a first closed circuit and a second closed circuit to generate a braking force for the first movable unit during operation of a dynamic brake, the first closed circuit including a first coil located in a center region of the stator coil array and a first resistance connected to the first coil, the second closed circuit including a second coil located in a region, which is other than the center region, of the stator coil array and a second resistance connected to the second coil,
wherein an electrical resistance value of the second resistance is less than an electrical resistance value of the first resistance, and
wherein the mover magnet opposes the second coil after the first movable unit and the second movable unit are in contact during operation of the dynamic brake.

19. A lithography apparatus which forms a pattern on a substrate, the apparatus comprising:
a stage apparatus configured to move the substrate,
wherein the stage apparatus including:
a first movable unit;
a linear motor that includes a stator coil array arranged over a stroke range in a predetermined direction of the first movable unit and a mover magnet fixed to the first movable unit, the mover magnet opposing the stator coil array;
a second movable unit that is arranged to face the first movable unit via a space and relatively moves with respect to the first movable unit in the predetermined direction; and
a switch unit configured to form a first closed circuit and a second closed circuit to generate a braking force for the first movable unit during operation of a dynamic brake, the first closed circuit including a first coil located in a center region of the stator coil array, the second closed circuit including a second coil located in a region, which is other than the center region, of the stator coil array,
wherein an electrical resistance value of the second coil is less than an electrical resistance value of the first coil, and
wherein the mover magnet opposes the second coil after the first movable unit and the second movable unit are in contact during operation of the dynamic brake.

20. A method of manufacturing an article, the method comprising steps of:
forming a pattern on a substrate using a lithography apparatus; and
processing the substrate on which the pattern has been formed to manufacture the article,
wherein the lithography apparatus including:
a stage apparatus configured to move the substrate,
wherein the stage apparatus including:
a first movable unit;
a linear motor that includes a stator coil array arranged over a stroke range in a predetermined direction of the first movable unit and a mover magnet fixed to the first movable unit, the mover magnet opposing the stator coil array;

a second movable unit that is arranged to face the first movable unit via a space and relatively moves with respect to the first movable unit in the predetermined direction; and a switch unit configured to form a first closed circuit and a second closed circuit to generate a braking force for the first movable unit during operation of a dynamic brake, the first closed circuit including a first coil located in a center region of the stator coil array and a first resistance connected to the first coil, the second closed circuit including a second coil located in a region, which is other than the center region, of the stator coil array and a second resistance connected to the second coil, wherein an electrical resistance value of the second resistance is less than an electrical resistance value of the first resistance, and wherein the mover magnet opposes the second coil after the first movable unit and the second movable unit are in contact during operation of the dynamic brake.

21. A method of manufacturing an article, the method comprising steps of:

forming a pattern on a substrate using a lithography apparatus; and processing the substrate on which the pattern has been formed to manufacture the article wherein the lithography apparatus including:

a stage apparatus configured to move the substrate, wherein the stage apparatus including:

a first movable unit;

a linear motor that includes a stator coil array arranged over a stroke range in a predetermined direction of the first movable unit and a mover magnet fixed to the first movable unit, the mover magnet opposing the stator coil array;

a second movable unit that is arranged to face the first movable unit via a space and relatively moves with respect to the first movable unit in the predetermined direction; and a switch unit configured to form a first closed circuit and a second closed circuit to generate a braking force for the first movable unit during operation of a dynamic brake, the first closed circuit including a first coil located in a center region of the stator coil array, the second closed circuit including a second coil located in a region, which is other than the center region, of the stator coil array, wherein an electrical resistance value of the second coil is less than an electrical resistance value of the first coil, and wherein the mover magnet opposes the second coil after the first movable unit and the second movable unit are in contact during operation of the dynamic brake.

* * * * *